(12) United States Patent
Liu (10) Patent No.: US 10,770,423 B2
(45) Date of Patent: Sep. 8, 2020

(54) CLAMPING SYSTEM, WIRE BONDING MACHINE, AND METHOD FOR BONDING WIRES

(71) Applicants: Semiconductor Manufacturing International (Shanghai) Corporation, Shanghai (CN); Semiconductor Manufacturing International (Beijing) Corporation, Beijing (CN)

(72) Inventor: Qi Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 535 days.

(21) Appl. No.: 15/472,812

(22) Filed: Mar. 29, 2017

(65) Prior Publication Data
US 2017/0301644 A1    Oct. 19, 2017

(30) Foreign Application Priority Data
Apr. 15, 2016   (CN) .......................... 2016 1 0237037

(51) Int. Cl.
*B23K 20/00*    (2006.01)
*H01L 23/00*    (2006.01)
(Continued)

(52) U.S. Cl.
CPC ............ *H01L 24/78* (2013.01); *B23K 20/004* (2013.01); *B23K 20/26* (2013.01); *H01L 24/85* (2013.01); *B23K 2101/40* (2018.08); *B23K 2101/42* (2018.08); *H01L 24/48* (2013.01); *H01L 2224/48227* (2013.01); *H01L 2224/78251* (2013.01); *H01L 2224/78621* (2013.01); *H01L 2224/78701* (2013.01);
(Continued)

(58) Field of Classification Search
CPC ......... B25B 5/006; B25B 5/068; B25B 5/163; B23K 20/004
See application file for complete search history.

(56) References Cited

U.S. PATENT DOCUMENTS 4,834,352 A * 5/1989 Thornton ................ B25B 5/06
269/203
5,106,065 A * 4/1992 Staton .................. F16F 9/0209
188/269
(Continued)

FOREIGN PATENT DOCUMENTS

| CN | 202428087 U | 9/2012 |
| CN | 105357882 A | 2/2016 |
| KR | 20080113700 A | 12/2008 |

OTHER PUBLICATIONS

The European Patent Office (EPO) The Extended European Search Report for 17166512.8 dated Aug. 29, 2017 18 Pages.

*Primary Examiner* — Erin B Saad
(74) *Attorney, Agent, or Firm* — Anova Law Group, PLLC (57) ABSTRACT

A clamping system, a wire bonding machine and a method for bonding wires are provided. An exemplary clamping system includes a clamping device. The clamping device includes: at least one linear guide rail; a first clamping rod arranged perpendicular to the linear guide rail; and a second clamping rod arranged perpendicular to the linear guide rail and parallel to the first clamping rod.

21 Claims, 5 Drawing Sheets

(51) Int. Cl.
*B23K 20/26* (2006.01)
*B23K 101/40* (2006.01)
*B23K 101/42* (2006.01)

(52) U.S. Cl.
CPC ............... *H01L 2224/78704* (2013.01); *H01L 2224/78804* (2013.01); *H01L 2224/852* (2013.01); *H01L 2224/85181* (2013.01)

(56) References Cited

U.S. PATENT DOCUMENTS

| | | | |
|---|---|---|---|
| 5,242,103 A | | 9/1993 | Denvir |
| 5,307,978 A | * | 5/1994 | Ricketson ......... H01L 21/67144 228/4.5 |
| 6,619,535 B1 | | 9/2003 | Imanishi et al. |
| 2012/0302009 A1 | | 11/2012 | Sekihara et al. |
| 2012/0314265 A1 | * | 12/2012 | Aoshima ............ H05K 13/0812 358/474 |

* cited by examiner

CLAMPING SYSTEM, WIRE BONDING MACHINE, AND METHOD FOR BONDING WIRES

CROSS-REFERENCES TO RELATED APPLICATIONS

This application claims the priority of Chinese patent application No. 201610217037.5, filed on Apr. 15, 2016, the entirety of which is incorporated herein by reference.

FIELD OF THE DISCLOSURE

The present disclosure generally relates to the field of semiconductor packaging technology and, more particularly, relates to a clamping system, a wire bonding machine, and methods for bonding wires, for example, in chip on board (COB) rapid packaging technology.

BACKGROUND

Semiconductor packaging is a process of obtaining an independent chip by processing a wafer passed the test based on the product model and functional requirements. The semiconductor packaging includes plastic packaging, ceramic packaging, etc. The semiconductor packaging also includes flip-chip, chip on board (COB), etc. Among them, the COB packaging is a very effective and convenient packaging form in the chip verification and development processes.

By a COB packaging technology, the integrated circuit chip is directly fixed to a base with other surface mount (SMT) and pin in hole (PIH) components. Currently, a printed circuit board (PCB) is usually used as the base. In an existing COB packaging process, when bridging the wafer and a corresponding pad on the PCB board, the PCB board needs to be tightly secured on a clamping device to ensure that the PCB board in the wire bonding area cannot move.

However, it is difficult for a conventionally-used clamping device to fix the PCB board. Errors in wiring positions may occur by the wire bonding machine, producing defective products. In addition, the conventionally-used clamping device has a limited size range and only PCB boards fall within this limited size range may be used. Therefore, multiple sets of clamping devices with different sizes may have to be prepared in order to be used with different PCB boards. Further, when the PCB board is fixed, it is easy to cause local deformation of the PCB board. When the PCB board is heated, more deformation may occur.

The disclosed system, machine, and methods are directed to solve one or more problems set forth above and other problems.

BRIEF SUMMARY OF THE DISCLOSURE

One aspect of the present disclosure includes clamping system in a wire bonding machine. The clamping system includes a clamping device including: at least one linear guide rail; a first clamping rod arranged perpendicular to the linear guide rail; and a second clamping rod arranged perpendicular to the linear guide rail and parallel to the first clamping rod.

Another aspect of the present disclosure includes a wire bonding machine. The machine includes a clamping device including: at least one linear guide rail; a first clamping rod arranged perpendicular to the linear guide rail; and a second clamping rod arranged perpendicular to the linear guide rail and parallel to the first clamping rod.

Another aspect of the present disclosure includes a process of bonding wires. The process includes adjusting a position of a first clamping rod in a linear guide rail based on length and width of a PCB board and a position of a wire bonding area in the PCB board to ensure the position of the wire bonding area in the PCB board is within a positioning frame, and fixing the first clamping rod to the linear guide rail by card slots. The process also includes placing the PCB board between the first clamping rod and a second clamping rod, and fixing the PCB board by rotating the driving screw rod to drive the second clamping rod to move. In addition, the process includes adjusting a distance between a heating part and a base part by rotating the heating part to ensure an upper end surface of the heating part is abutted on the PCB board, and adjusting a position of a heating block in the positioning frame by rotating a first positioning screw rod and a second positioning screw rod to ensure the heating part is abutted on the wire bonding area in the PCB board. Moreover, the process includes heating the heating part by a ceramic heating rod and a heating rod cable. Further, the process includes bonding wire to a pad on a wafer and to a corresponding pad on the PCB board when a temperature of the wire bonding area in the PCB board reaches a desired value, and repeating the steps of bonding wire to the pad on the wafer and to the pad on the PCB board until all the pads are bridged.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
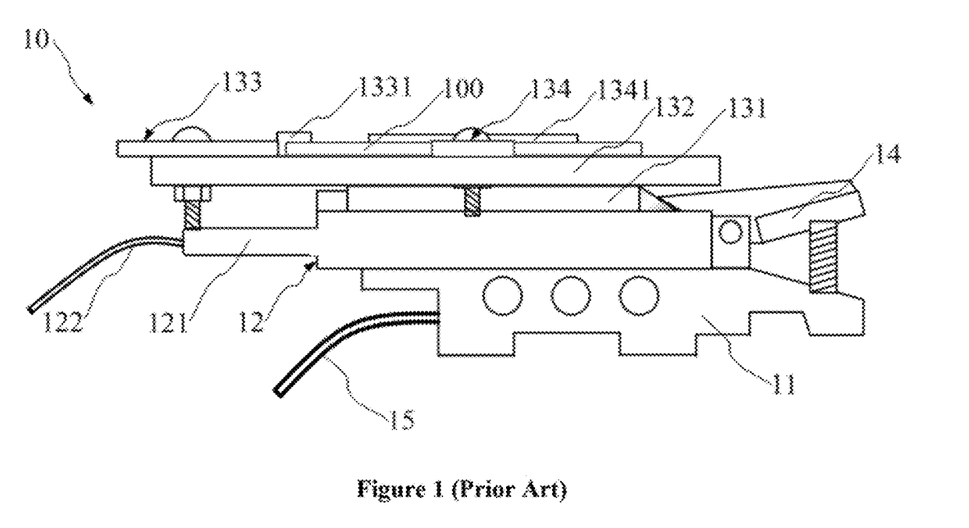
FIG. 1 illustrates a schematic of an existing wire bonding machine clamping system.
Figure 2:
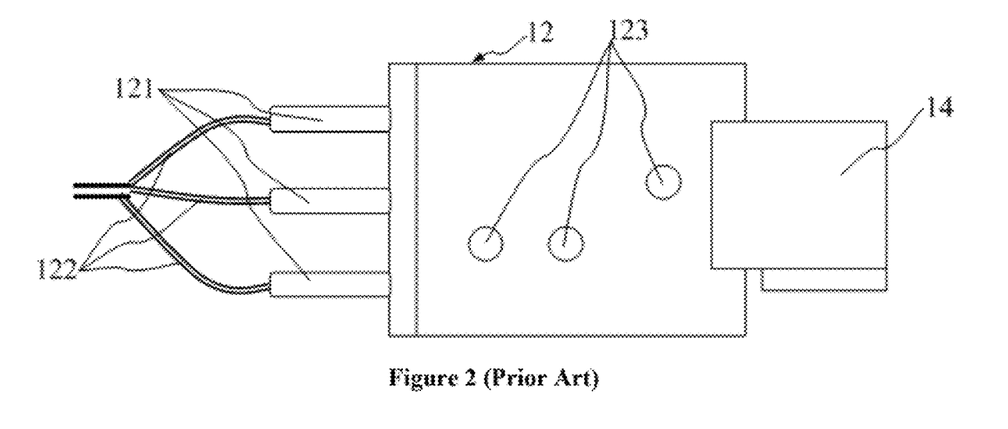
FIG. 2 illustrates a top view of a heating device of an existing wire bonding machine clamping system.
Figure 3:
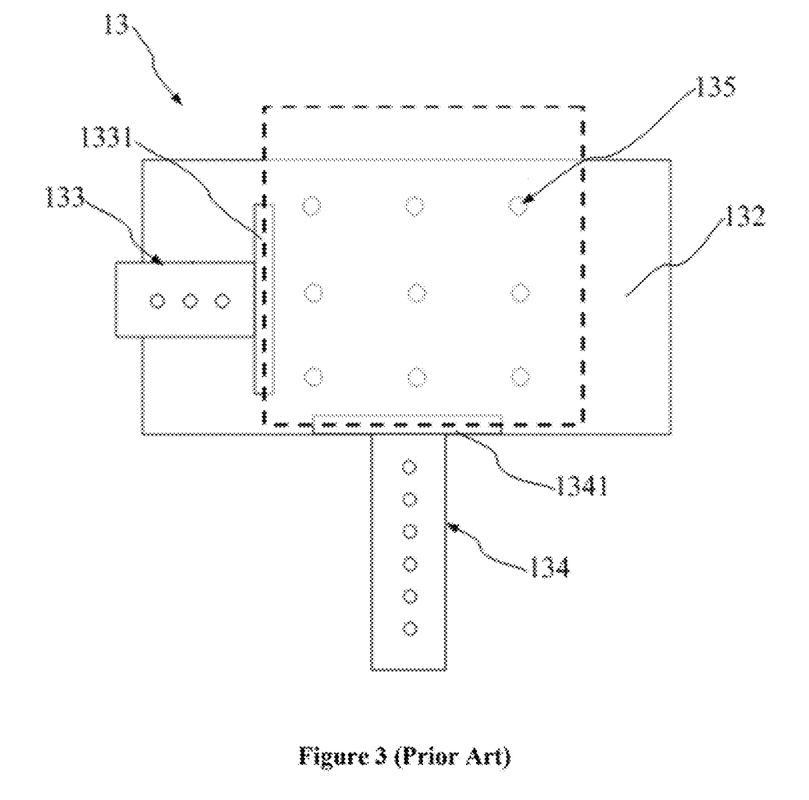
FIG. 3 illustrates a top view of a clamping device of an existing wire bonding machine clamping system.

Referring to FIGS. 1-3, an existing clamping system 10 in a wire bonding machine includes a supporting platform 11, a heating device 12, a clamping device 13, and a fixing device 14.

The supporting platform 11 is formed at the bottom of the clamping system 10 in wire bonding machine. The supporting platform 11 is configured to support the heating device 12, the clamping device 13, and the fixing device 14. One end of a vacuum tube 15 is connected to a vacuum pumping device (not labeled), and the other end of the vacuum tube 15 passes through the supporting platform 11.

Referring to FIG. 2, the heating device 12 is secured on the supporting platform 11. The heating device 12 includes a ceramic heating rod 121 and a heating rod cable 122. A plurality of first through-holes 123 are formed on the surface of the heating device 12, and the first through-holes 123 are connected to the vacuum tube 15.

Referring to FIG. 3, the clamping device 13 is formed on the heating device 12. The clamping device 13 includes a base 131, a loading plate 132, a first damp 133, and a second clamp 134. A plurality of second through-holes 135 are formed on the base 131 and the loading plate 132. The second through-holes 135 are connected to the first through-holes 123. A first clamping portion 1331 and a second clamping portion 1341 are respectively formed on the first clamp 133 and the second clamp 134 and exhibit an L-shape used to fix the PCB board. As shown in FIG. 3, the dotted line position indicates a position for placing the PCB board. The first clamping portion 1331 and the second clamping portion 1341 are perpendicularly arranged on the loading plate, and can adjust their positions in their respective stroke ranges.

The first clamp 133 and the second damp 134 of the clamping system 10 in wire bonding machine are perpendicularly arranged on the loading plate, thus the force applied to the PCB board is uneven, easily causing local deformation of the PCB board.

In addition, when the wire bonding machine operates, the PCB board is placed on the loading plate. Two ends of the PCB board respectively fall in two grooves formed by the first clamping portion, the second clamping portion, and the loading plate. The thickness of the PCB board is equal to or slightly larger than the width of the two grooves. Therefore, the PCB board is secured. However, the accuracy requirements of the thickness of the PCB board are different based on the materials, and applications. In general, the thickness error of the PCB boards of the same batch is approximately 0.1 mm. The width of the groove formed by the clamping portion and the loading plate in the existing design of the clamping portion cannot be changed. Therefore, when using the same clamping device to secure the PCB boards of a same batch, the PCB boards may not be effectively fixed.

Figure 4:
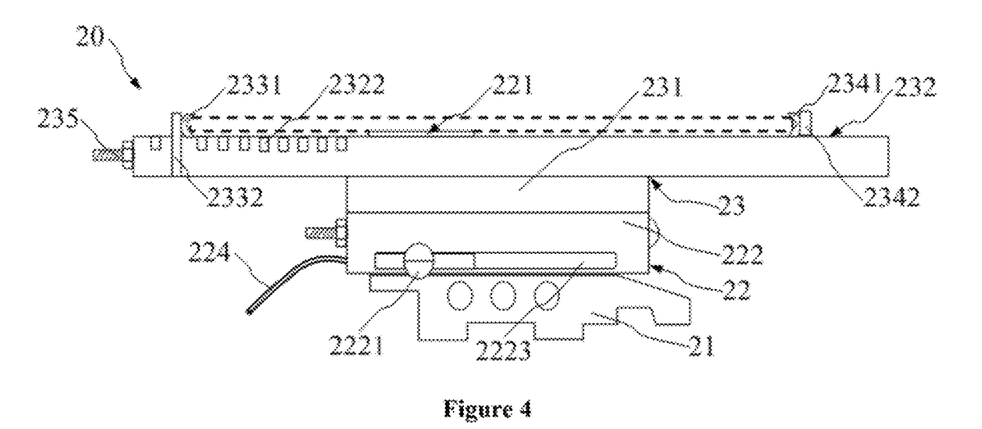
FIG. 4 illustrates a schematic of an exemplary clamping system in a wire bonding machine consistent with various disclosed embodiments of the present disclosure.
Figure 5:
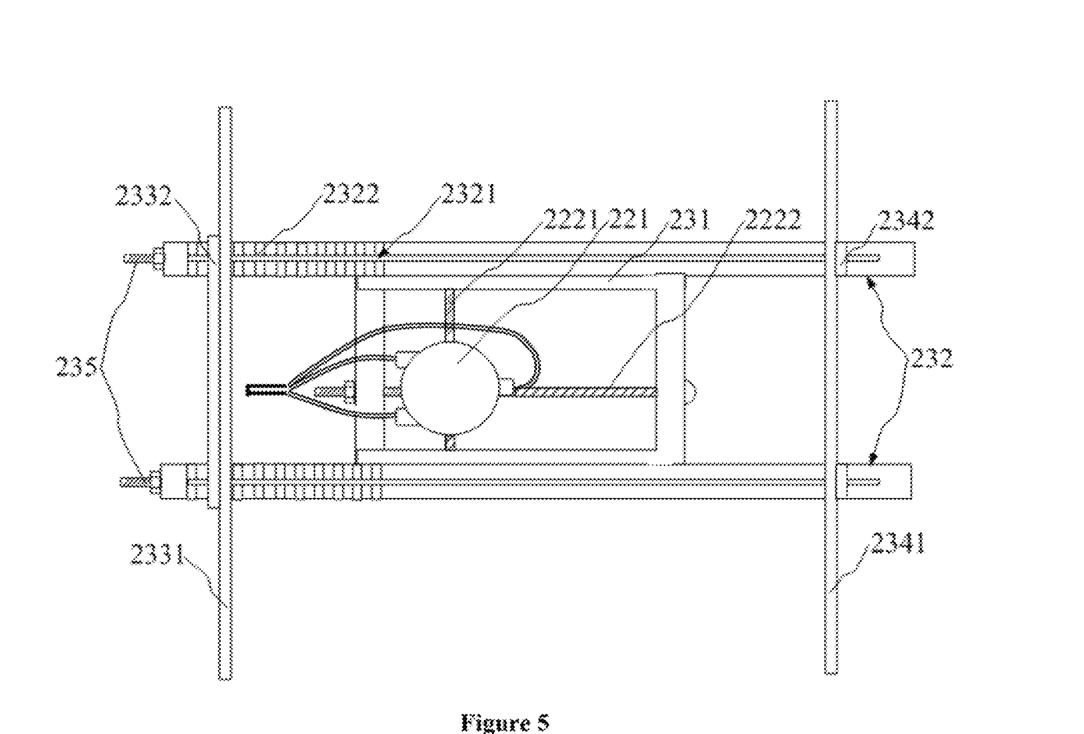
FIG. 5 illustrates a top view of the clamping system in wire bonding machine shown in FIG. 4.
Figure 6:
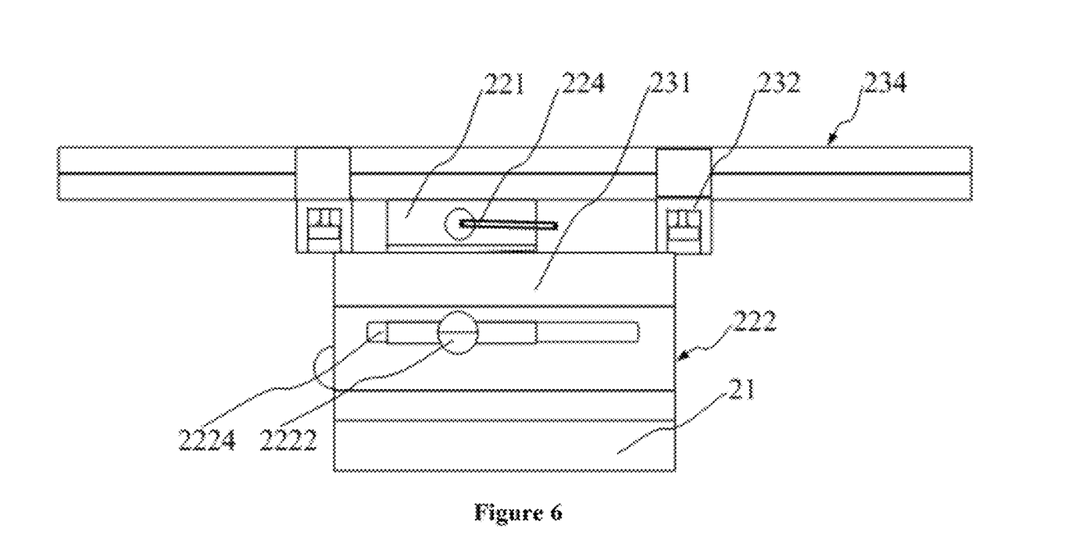
FIG. 6 illustrates a right side view of the clamping system in wire bonding machine shown in FIG. 4.
Figure 7:
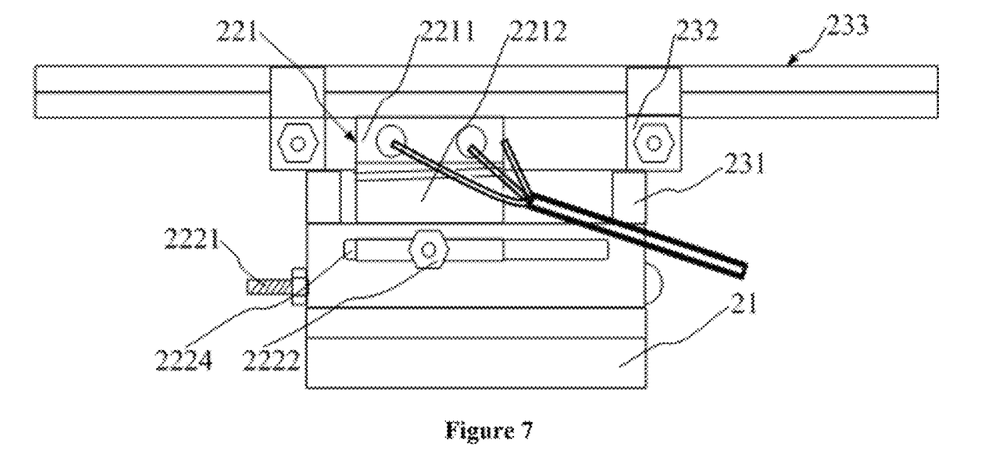
FIG. 7 illustrates a left side view of the clamping system in wire bonding machine shown in FIG. 4.
Figure 8:
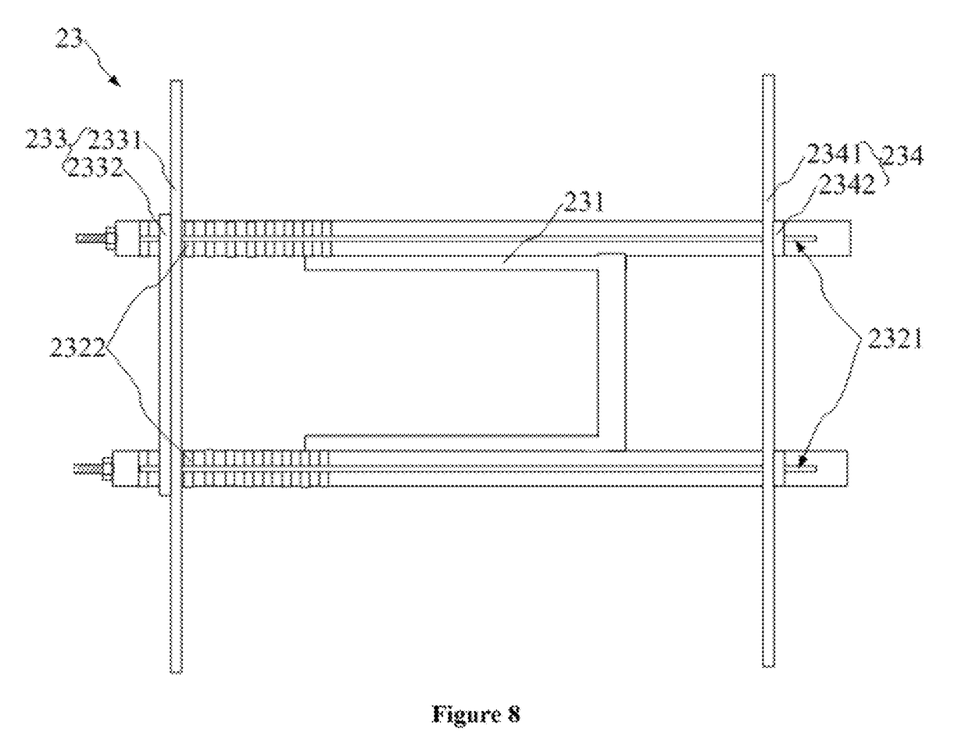
FIG. 8 illustrates a top view of a clamping device of a clamping system in a wire bonding machine consistent with various disclosed embodiments of the present disclosure.
Figure 9:
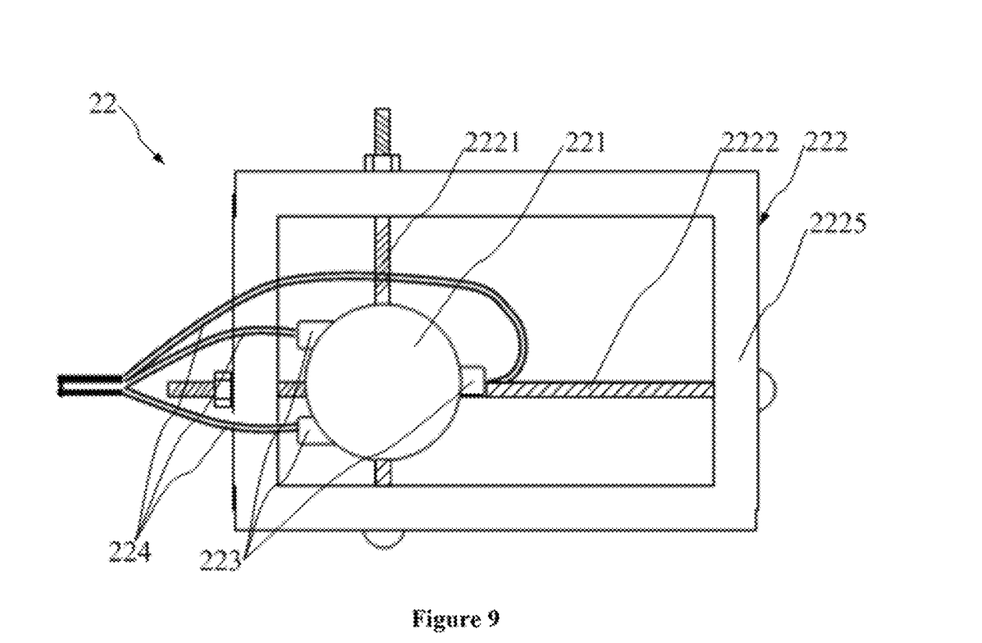
FIG. 9 illustrates atop view of a heating device of a clamping system in a wire bonding machine consistent with various disclosed embodiments of the present disclosure.
Figure 10:
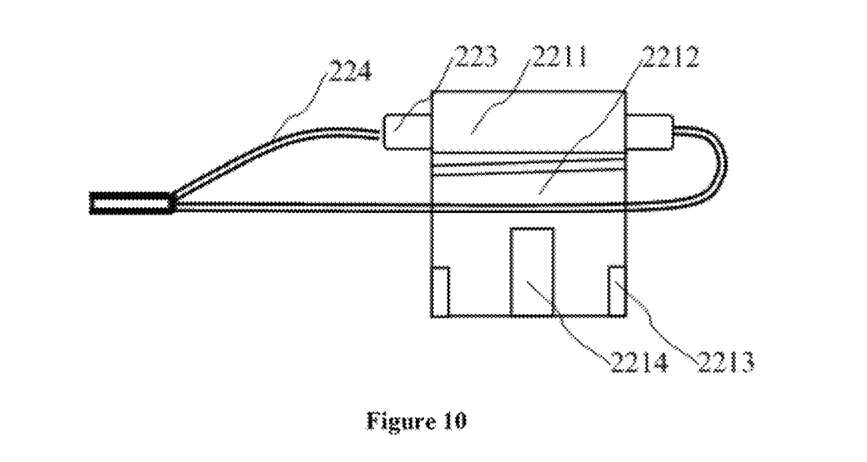
FIG. 10 illustrates a schematic of a heating block of a clamping system in a wire bonding machine consistent with various disclosed embodiments of the present disclosure.

The present disclosure provides a clamping system in a wire bonding machine. FIG. 4 illustrates a schematic of the clamping system in a wire bonding machine consistent with the disclosed embodiments; FIG. 5 illustrates a top view of the clamping system in the wire bonding machine shown in FIG. 4; FIG. 6 illustrates a right side view of the clamping system in the wire bonding machine shown in FIG. 4; FIG. 7 illustrates a left side view of the clamping system in the wire bonding machine shown in FIG. 4; FIG. 8 illustrates a top view of a clamping device of the clamping system in wire bonding machine consistent with the disclosed embodiments; FIG. 9 illustrates a top view of a heating device of the clamping system in wire bonding machine consistent with the disclosed embodiments; and FIG. 10 illustrates a schematic of a heating block of the clamping system in wire bonding machine consistent with the disclosed embodiments.

Referring to FIGS. 4-7, a clamping system 20 in a wire bonding machine may include a supporting platform 21, a heating device 22, and a clamping device 23. The supporting platform 21 may be formed at the bottom of the clamping system 20 in wire bonding machine, and be configured to support the heating device 22 and the clamping device 23. The heating device 22 may be secured on the supporting platform 21, and be configured to heat the PCB board during the wire bonding process. The clamping device 23 may be secured on the heating device 22, and be configured to fix the PCB board.

Referring to FIG. 5 and FIG. 8, the clamping device 23 may include a guide rail support 231, a linear guide rail 232, a first clamping rod 233, a second clamping rod 234, and a driving screw rod 235. The guide rail support 231 may be formed at the bottom of the clamping device 23, and be configured to support the linear guide rail 232. The linear guide rail 232 may be secured on, the guide rail support 231. The first clamping rod 233 and the second clamping rod 234 may be formed on the linear guide rail 232, and, be arranged perpendicular to the linear guide rail 232. The first clamping rod 233 and the second clamping rod 234 may be arranged in parallel. The driving screw rod 235 may be formed on the linear guide rail 232.

In one embodiment, the first clamping rod 233 may include a first clamping portion 2331 and a first fixing portion 2332. The second clamping rod 234 may include a second clamping portion 2341 and a second fixing portion 2342. The first fixing portion 2332 and the second fixing portion 2342 may be mounted on the linear guide rail 232. The first fixing portion 2332 and the second fixing portion 2342 may be configured to fix the first clamping rod 233 and the second clamping rod 234, respectively. The first clamping portion 2331 and the second clamping portion 2341 may be configured to clamp the PCB board placed there-between.

The lengths of the first clamping portion 2331 and the second clamping portion 2341 may be unlimited and may be designed to be the maximum value of the length of the PCB board.

Referring to FIG. 4, the dashed line position may indicate a position for placing the PCB board. Grooves may be respectively formed on the side surfaces of the first clamping portion 2331 and the second clamping portion 2341 that face toward one another, and the widths of the grooves may decrease as the depths of the grooves increase. During the wire bonding process, the thickness of the PCB hoard may not be a fixed value and may vary according to specific applications. If the width of the groove is a fixed value, when the thickness of the PCB board is too small, the clamping force of the clamping portion may be insufficient, resulting in up and down movement of the PCB board. When the thickness of the PCB board is too large, the PCB board cannot be properly inserted into the groove. The disclosed groove structure may allow the PCB board to be effectively fixed regardless of the thickness of the PCB board.

In another embodiment, the two side surfaces of the first clamping portion 2331 and the second clamping portion 2341 that face toward one another may have rough surfaces. The rough surfaces may provide the first clamping portion 2331 and the second clamping portion 2341 with a clamping force on the PCB board, to ensure that the PCB board is unmovable during the wire bonding process.

In certain embodiments, rubber coating layers may be respectively formed on the two side surfaces of the first clamping portion 2331 and the second clamping portion 2341 that face toward one another. The rubber coating layers may be contacted with two ends of the PCB board, and tiny deformation may occur at the contact position, thus the PCB board is unmovable. Moreover, the friction of the rubber coating layers is large, which may further ensure that the PCB board is unmovable during the wire bonding process.

In one embodiment, a plurality of card slots 2322 may be formed at the left portion of the linear guide rail 232, and the card slots 2322 may be spaced along a rail guiding direction. Among them, any card slot 2322 can be fixedly connected to the first fixing portion 2332. Therefore, by adjusting the installation of the first fixing portion 2332 with different card slots, the position of the first clamping rod 233 on the linear guide rail 232 can be changed.

A guide rail groove 2321 may be formed on the linear guide rail 232 along the rail guiding direction. The guide rail groove 2321 may be configured to accommodate the driving screw rod 235.

In one embodiment, the number of the linear guide rods 232 may be two, and the two linear guide rods 232 may be arranged in parallel with one another. The linear guide rods 232 may be configured to form the first clamping rod 233 and the second clamping rod 234 easily. In certain embodiments, only one linear guide rod may be formed. Alternatively a plurality of parallel linear guide rods may be formed. The length of the linear guide rod may be unlimited, and can be adjusted based on the size of the clamping object.

In one embodiment, the driving screw rod 235 may be formed in the guide rail groove 2321. One end of the driving screw rod 235 may be screwed to the second fixing portion 2342, and the other end of the driving screw rod 235 may be protruded outside the linear guide rail 232. The second fixing portion 2342 may be mounted on the linear guide rail 232, and can only move along the linear guide rail 232. Therefore, by rotating the protruded end of the driving screw rod 235, the second fixing portion 2342 (that is, the position of the second clamping rod 234) on the linear guide rail 232, can be adjusted.

In one embodiment, the position of the first clamping rod 233 may be adjusted by the card slots 2322. The position of the second clamping rod 324 may be adjusted by the driving screw rod 235. Therefore, all the PCB boards with different lengths and/or widths can be fixed by adjusting the first clamping rod 233 and the second clamping rod 234. Thus, the equipment may be simplified.

In another embodiment, one of the first clamping rod and the second clamping rod can be fixed on the linear guide rail, and position thereof cannot be adjusted. The PCB board can be fixed by only adjusting the position of the other one clamping rod.

In certain embodiments, both the positions of the first clamping rod and the second clamping rod can be adjusted by the card slots formed on the linear guide rail. However, when adjusting the positions of the first clamping rod and the second clamping rod by the card slots, the change of the positions of the first clamping rod and the second clamping rod may not be continuous, thus the spacing between each card slot may need to be reasonably designed.

Both the first clamping rod and the second clamping rod can also be adjusted by the driving screw rod, and the process may include the following. Two groups of driving screw rods may be formed on the linear guide rail, be respectively fixed to the first clamping rod and the second clamping rod, and be configured to respectively adjust the positions of the first clamping rod and the second clamping rod.

Further, the first clamping rod and/or the second clamping rod can be adjusted by a spring, and the process may include the following. One end of the spring may be fixed to the linear guide rail, and the other end of the spring may be connected to the first clamping rod or the second clamping rod. The PCB board between the first clamping rod and the second clamping rod may be fixed by using the elastic force of the spring.

In certain other embodiments, the first clamping rod and/or the second clamping rod can be adjusted by other driving methods, such as an electrical driving device, etc. A sensor may be provided on the clamping surfaces of the first clamping rod and the second clamping rod to control the magnitude of the force clamping the PCB board.

Referring to FIG. 5 and FIG. 9, the heating device 22 may include a heating block 221 and a positioning block 222. The positioning block 222 may be secured on the supporting platform 21, be fixedly connected to the clamping device 23, and be configured to adjust the positon of the heating block 221. The heating block 221 may be formed on the positioning block 222, and be configured to heat the wire bonding area of the PCB board.

In one embodiment, the positioning block 222 may include a first positioning screw rod 2221, a second positioning screw rod 2222 and a positioning frame 2225. The first positioning screw rod 2221 and the second positioning screw rod 2222 may be perpendicularly arranged with one another, and be formed on the positioning frame 2225. The first positioning screw rod 2221 and the second positioning screw rod 2222 may be configured to adjust the position of the heating block 221 in the positioning frame 2225.

In one embodiment, the shape of the positioning frame 2225 may be a rectangle. A first positioning groove 2223 and a second positioning groove 2224 may be formed on the sidewalk of the positioning frame 2225 that face toward one another. The first positioning screw rod 2221 may be capable of moving in a plane formed by the first positioning groove 2223, and the second positioning screw rod 2222 may be capable of moving in a plane formed by the second positioning groove 2224.

Because the first positioning screw rod 2221 and the second positioning screw rod 2222 cannot be in contact, the plane formed by the first positioning groove 2223 and the plane formed by the second positioning groove 2224 may be parallel, while not at the same plane.

Referring to FIG. 9 and FIG. 10, the heating block 221 may be formed in the positioning frame 2225. The heating block 221 may include a heating part 2211 and a base part 2212. A first screw hole 2213 and a second screw hole 2214 may be formed on the base part 2212. The first positioning screw rod 2221 may be connected to the base part 2212 through the first screw hole 2213. The second positioning screw rod 2222 may be connected to the base part 2212 through the second screw hole 2214.

The minimum value of the length and width of the PCB board may be about 4 cm×4 cm. The maximum value of the wire bonding area in the PCB board may be about 1.5 cm×1.5 cm. The size range of the heating part 2211 may be in a range between the maximum value of the wire bonding area and the minimum value of the length and width of the PCB board.

If the size of the heating part 2211 is larger than the size of the PCB board, when the PCB board is clamped by the first clamping rod 233 and the second clamping rod 234, the heating part 221 cannot be in, contact with the PCB board, thus the wire bonding area in the PCB board cannot be effectively heated. If the size of the heating part 2211 is smaller than the size of the wire bonding area in the PCB board, the heating part 2211 cannot cover the wire bonding area in the PCB board, thus the wire bonding area in the PCB board cannot be effectively heated.

In one embodiment, the shape of the heating part 2211 may be a circular. In certain embodiments, other suitable shapes, such as a square, can also be used.

The heating part 2211 and the base part 2212 may be connected by a screw thread. The distance between the heating part 2211 and the base part 2212 can be adjusted by the screw thread. Therefore, for the PCB boards with different thicknesses, the heating part 2211 can be abutted on the PCB board by adjusting height, to ensure the temperature of the wire bonding area in the PCB board.

In certain embodiments, the heating part 2211 and the base part 2212 may be connected by other methods capable of adjusting the distance between the heating part 2211 and the base part 2212, such as a pin connection.

In certain other embodiments, a plurality of mounting positions may be formed on the upper end surface of the base part. The mounting positions may cooperate with the heating part to change the position of the heating part in the horizontal direction and the vertical direction.

In one embodiment, the heating device 22 may also include a ceramic heating rod 223, and a heating rod cable 224. The ceramic heating rod 223 may be fixedly connected to the heating part 2211, and the heating rod cable 224 may be fixedly connected to the ceramic heating rod 223 to heat the heating part 2211.

In one embodiment, the PCB board may be fixed by the clamping device 23 and the heating device 22. The process of bonding wires at a specific position may include the following.

Based on the length and width of the PCB board and the positon of the wire bonding area in the PCB board, the position of the first clamping rod 233 in the linear guide rail 232 may be adjusted, and the first clamping rod 233 may be fixed to the linear guide rail 232 by the card slots 2322.

The PCB board may be placed between the first clamping rod 233 and the second clamping rod 234. The PCB board may be fixed by rotating the driving screw rod 235 to drive the second clamping rod 234 to move, and to ensure the position of the wire bonding area in the PCB board is within the positioning frame 2225.

The distance between the heating part 2211 and the base part 2212 may be adjusted by rotating the heating part 2211, thus the upper end surface of the heating part 2211 may be abutted on the PCB board.

The position of the heating block 221 in the positioning frame 2225 may be adjusted by rotating the first positioning screw rod 2221 and the second positioning screw rod 2222, thus the heating part 2211 may be abutted on the wire bonding area in the PCB board. The heating part 2211 may be heated by the ceramic heating rod 223 and the beating rod cable 224. When the temperature of the wire bonding area in the PCB board reaches a desired value, a wire may be first bonded to a pad on the wafer, and then be bonded to a corresponding pad on die PCB board. The steps of bonding wire to the pad on the wafer and the pad on the PCB board may be repeated until all the pads are bridged.

Accordingly, in the clamping system in wire bonding machine consistent with the disclosed embodiments, the first clamping rod and the second clamping rod are arranged in parallel with one another and perpendicular to the linear guide rail. When fixing the PCB board and other objects, the first clamping rod and the second clamping rod can effectively fixedly clamp the object from the two sides of the object that face toward one another, thus the object may be unmovable. Therefore, the accuracy of the position of bonding wires and the product yield may be improved.

In addition, at least one of the first clamping rod and the second clamping rod may be capable of moving along the linear guide rail. The PCB board and other objects with different sizes can be fixed by adjusting the distance between the first clamping rod and the second clamping rod. Therefore, multiple sets of clamping devices with different sizes may not need to be prepared, and costs may be saved.

Further, the heating block may be capable of moving in the plane where the positioning block is located. This ensures that only the wire bonding area in the PCB board can be heated as required, while the other area of the PCB board is not heated. Deformation of the PCB board may not be generated.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A clamping system in a wire bonding machine, comprising:
    a clamping device including:
    at least one linear guide rail;
    a first clamping rod arranged perpendicular to the linear guide rail;
    a second clamping rod arranged perpendicular to the linear guide rail and parallel to the first clamping rod; and
    a plurality of card slots spaced apart from one another along a rail guiding direction on the linear guide rail, the plurality of card slots being capable of mounting one or more of the first clamping rod and the second clamping rod.

2. The system according to claim 1, further including:
    more than one the linear guide rails, arranged in parallel with one another.

3. The system according to claim 1, further including:
    a heating device formed at a bottom of the clamping device and fixedly connected to the clamping device.

4. The system according to claim 3, wherein the heating device includes:
    a positioning block, fixedly connected to the clamping device; and
    a heating block, connected to the positioning block, wherein the positioning block is configured to adjust a position of the heating block.

5. The system according to claim 4, wherein the positioning block includes:
    a first positioning screw rod, screwed to the heating block, wherein the heating block moves along an axis direction of the first positioning screw rod when rotating the first positioning screw rod; and
    a second positioning screw rod, arranged perpendicular to the first positioning screw rod and screwed to the heating block, wherein the heating block moves along an axis direction of the second positioning screw rod when rotating the second positioning screw rod.

6. The system according to claim 4, wherein the heating block includes:
   a base part, connected to the positioning block; and
   a heating part, fixedly connected to the base part, wherein a distance between the heating part and the base part is adjustable.

7. The system according to claim 6, wherein:
   the heating part and the base part are in a threaded connection or a pin connection.

8. The system according to claim 6, further including:
   a ceramic heating rod, fixedly connected to the heating part; and
   a heating rod cable, fixedly connected to the ceramic heating rod.

9. The system according to claim 6, wherein the base part includes:
   a first screw hole, wherein a first positioning screw rod is connected to the base part through the first screw hole; and
   a second screw hole, wherein a second positioning screw rod is connected to the base part through the second screw hole.

10. A wire bonding machine, comprising:
    a clamping device including:
    at least one linear guide rail;
    a first clamping rod arranged perpendicular to the linear guide rail;
    a second clamping rod arranged perpendicular to the linear guide rail and parallel to the first clamping rod; and
    a plurality of card slots spaced apart from one another along a rail guiding direction on the linear guide rail, the plurality of card slots being capable of mounting one or more of the first clamping rod and the second clamping rod.

11. The machine according to claim 10, further including:
    a heating device formed at a bottom of the clamping device and fixedly connected to the clamping device.

12. The system according to claim 1, wherein:
    side surfaces, of the first clamping rod and the second clamping rod, that face toward each other include rubber coating layers.

13. The system according to claim 1, wherein:
    side surfaces, of the first clamping rod and the second clamping rod, that face toward each other are configured with grooves used to clamp ends of a clamping object.

14. The system according to claim 1, wherein:
    at least one of the first clamping rod and the second clamping rod is capable of moving along the linear guide rail.

15. The system according to claim 14, further including:
    a driving component mounted on the linear guide rail, wherein the driving component drives one or more of the first clamping rod and the second clamping rod to move along the linear guide rail, wherein the driving component includes one of a driving screw rod and a spring.

16. The system according to claim 15, wherein:
    when the driving component is the driving screw,
    a guide rail groove accommodating the driving screw rod is formed on the linear guide rail along a rail guiding direction; and
    the driving screw rod is driven by and thread-connected to one of the first clamping rod and the second clamping rod.

17. The system according to claim 15, wherein:
    when the driving component is the spring,
    the spring has one end fixed to the linear guide rail, and has another end connected to one of the first clamping rod and the second clamping rod for driving the spring; and
    the spring is elastically deformed along a rail guiding direction.

18. The machine according to claim 10, wherein:
    side surfaces, of the first clamping rod and the second clamping rod, that face toward each other include rubber coating layers.

19. The machine according to claim 10, wherein:
    side surfaces, of the first clamping rod and the second clamping rod, that face toward each other are configured with grooves used to clamp ends of a clamping object.

20. The machine according to claim 10, wherein:
    at least one of the first clamping rod and the second clamping rod is capable of moving along the linear guide rail.

21. The machine according to claim 20, wherein the clamping device further includes:
    a driving component mounted on the linear guide rail, wherein the driving component drives one or more of the first clamping rod and the second clamping rod to move along the linear guide rail, wherein the driving component includes one of a driving screw rod and a spring.

* * * * *